United States Patent [19]
Rhee et al.

[11] Patent Number: 6,133,147
[45] Date of Patent: Oct. 17, 2000

[54] PROCESS FOR SELECTIVE METAL DEPOSITION IN HOLES OF SEMICONDUCTOR DEVICE

[75] Inventors: Shi-Woo Rhee; Jong-Ho Yun, both of Pohang-shi, Rep. of Korea

[73] Assignee: Postech Foundation, Rep. of Korea

[21] Appl. No.: 09/139,701

[22] Filed: Aug. 25, 1998

[30] Foreign Application Priority Data

Aug. 26, 1997 [KR] Rep. of Korea ............. 97-40890

[51] Int. Cl.$^7$ .............. H01L 21/44; B05D 5/12
[52] U.S. Cl. ............ 438/677; 438/672; 438/675; 427/97; 427/99; 427/282
[58] Field of Search .............. 427/97, 99, 282, 427/336, 337; 438/669, 672, 675, 677

[56] References Cited

U.S. PATENT DOCUMENTS

| | | | |
|---|---|---|---|
| 5,135,779 | 8/1992 | Viehbeck et al. | 427/304 |
| 5,844,318 | 12/1998 | Sandhu et al. | 257/774 |

*Primary Examiner*—Brian K. Talbot
*Attorney, Agent, or Firm*—Anderson Kill & Olick, PC

[57] ABSTRACT

A process for preparing a metallic interconnecting plug in a semiconductor device which comprises the steps of: i) forming an insulating layer on the surface of a semiconductor substrate or a metal underlayer of the semiconductor device, ii) forming a hole in the insulating layer to expose the surface of the semiconductor substrate or the metal underlayer, iii) exposing the surface of the insulating layer to the vapor of a blocking agent under a pressure ranging from $10^{-12}$ to 10 torr for a controlled time period so that a blocking layer is formed only on the outer surface of the insulating layer, the blocking layer not extending over the inside walls of the hole, iv) selectively depositing a conductive metal in the hole using a chemical vapor deposition method to form the metallic interconnecting plug which extends from the surface of the semiconductor substrate or the metal underlayer to the level of the outer surface of the insulating layer, and v) removing the blocking layer from the surface of the insulating layer.

8 Claims, 6 Drawing Sheets

PROCESS FOR SELECTIVE METAL DEPOSITION IN HOLES OF SEMICONDUCTOR DEVICE

FIELD OF THE INVENTION

The present invention relates to a process for depositing a metal in contact or via holes; and more particularly, to a chemical vapor deposition process for selectively depositing aluminum in contact or via holes of a semiconductor device to form conductive plugs.

BACKGROUND OF THE INVENTION

A chemical vapor deposition method refers to a process for forming a thin film having a desired constitution onto a substrate by the steps of: transport of the vapor of a reactant to the substrate surface; adsorption of the reactant on the surface; chemical reaction and diffusion on the surface to form a thin film on the surface; and desorption of by-products from the surface. The chemical vapor deposition method has advantages in that: a thin film can be formed at a relatively low temperature; the film composition can be controlled; and it is possible to selectively deposit a film on a specific surface of a substrate. In a selective deposition method, a thin film is deposited on a desired area by way of enhancing the surface reactivity of the desired area toward the reactant.

Semiconductor devices have recently become highly integrated and the concomitant decrease in the line width of an integrated circuit pattern requires the use of advanced microprocessing techniques. For example, holes of updated semiconductor devices have much smaller diameters and higher aspect ratios than before.

A contact or via structure of a semi-conductor device is generally formed by depositing a metal in contact or via holes generated in an insulating layer, e.g., silicon oxide ($SiO_2$), to form conductive metal plugs which connect the semiconductor substrate or metal layer with a wiring layer. Such metal plugs are conventionally prepared by blanket deposition and etch-back which is explained in conjunction with FIGS. 1A and 1B, as follows:

First, an insulating layer(20), e.g., a silicon oxide($SiO_2$) layer is deposited on a silicon substrate(10) and a contact or via hole(30) is generated through the insulating layer(20) by a conventional etching method. Subsequently, a metal is vapor-deposited both on the top surface of the insulating layer(20) and the inside of the hole(30) to form a continuous metal layer(40). Then, the metal layer is etched back to obtain a metal plug(40) as shown in FIG. 1B. However, the step of forming the metal plug by etching the metal layer is cumbersome and requires complicated lithographic techniques.

In order to solve the above problem, selective metal deposition in holes has been attempted(see M. J. Hampden-Smith et al., *Chem. Vap. Deposition*, 1(2), 1995), as is explained below, in conjunction with FIGS. 2A and 2B.

An insulating layer(120) containing a hole (130) is formed on top of a silicon substrate(110) in a conventional manner, and then, a metal layer (140) is formed within the hole (130) by a surface-selective chemical vapor deposition method to form a filled hole as shown in FIG. 2A.

However, the above surface-selective thin layer formation process can not be applied in case when the hole and insulating layer are covered with a same surface, e.g., a diffusion barrier. Further, the surface-selectivity is easily lost.

Therefore, there has existed a need to develop a cost-effective, simple method to fabricate a contact or via structure of a semi-conductor devices.

SUMMARY OF THE INVENTION

Accordingly, it is a primary object of the present invention to provide a process for forming conductive metal plugs with excellent efficiency, reproducibility and reliability by way of depositing a metal selectively in contact or via holes.

In accordance with the present invention, there is provided a process for preparing a metallic interconnecting plug in a semiconductor device which comprises the steps of: i) forming an insulating layer on the surface of a semiconductor substrate or a metal underlayer of the semiconductor device, ii) forming a hole in the insulating layer to expose the surface of the semiconductor substrate or the metal underlayer, iii) exposing the surface of the insulating layer to the vapor of a blocking agent under a pressure ranging from $10^{-12}$ to 10 torr for a controlled time period so that a blocking layer is formed only on the outer surface of the insulating layer, the blocking layer not extending over the inside walls of the hole, iv) selectively depositing a conductive metal in the hole using a chemical vapor deposition method to form the metallic interconnecting plug which extends from the surface of the semiconductor substrate or the metal underlayer to the level of the outer surface of the insulating layer, and v) removing the blocking layer from the surface of the insulating layer.

BRIEF DESCRIPTION OF THE DRAWINGS

The above and other objects and features of the present invention will become apparent from the following description of the invention, when taken in conjunction with the accompanying drawings, in which.

DETAILED DESCRIPTION OF THE INVENTION

In the present invention, the term "hole of semiconductor devices" include contact holes generated in an insulating layer on the surface of a semiconductor substrate and via holes formed in an insulating layer deposited on a metal underlayer of a semiconductor device.

The formation of a metal film by a chemical vapor deposition(CVD) method is preferably conducted under a low pressure for the advantages of reduced contaminant levels and improved uniformity and step coverage of the deposited layer.

In a low pressure CVD process under a pressure ranging from $10^{-12}$ to 10 Torr, a gas molecule attains a mean free path in the order of 10 to 1000 μm. Therefore, in a hole having a diameter of 1 μm or less and an aspect ratio of 4 to 10, the diffusion of a gas molecule follows the Knudsen diffusion wherein the movement of a gas molecule is controlled by its collision with the wall rather than by its collision with other gas molecules like in the bulk diffusion. Due to this wall resistance, the diffusion rate of a gas molecule in the Knudsen diffusion region is slower than the bulk diffusion rate by a factor of 1,000 to 10,000. The Knudsen diffusion rate is expressed by equation 1.

$$D_{K,\infty} = \frac{2r}{3}\left(\frac{8RT}{\pi M}\right)^{1/2} \quad \text{(Eq. 1)}$$

wherein:
r is hole radius,
R is the gas constant,
T is the temperature of the gas, and
M is the molecular weight.

Figure 1A:
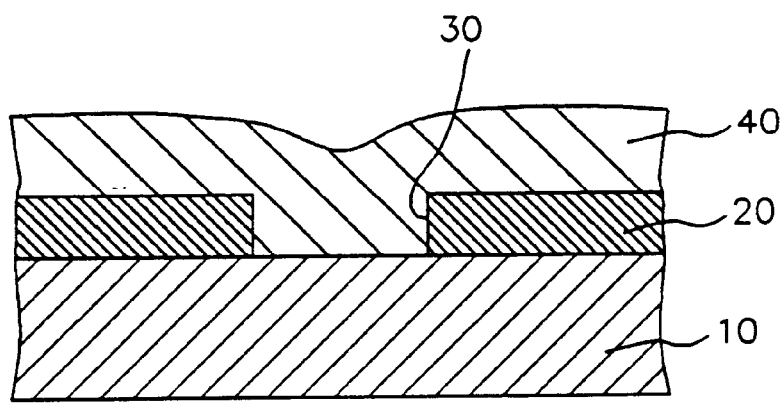
FIGS. 1A and 1B show schematic diagrams of a conventional process of forming metal plugs using blanket deposition and etch-back method.
Figure 1B:
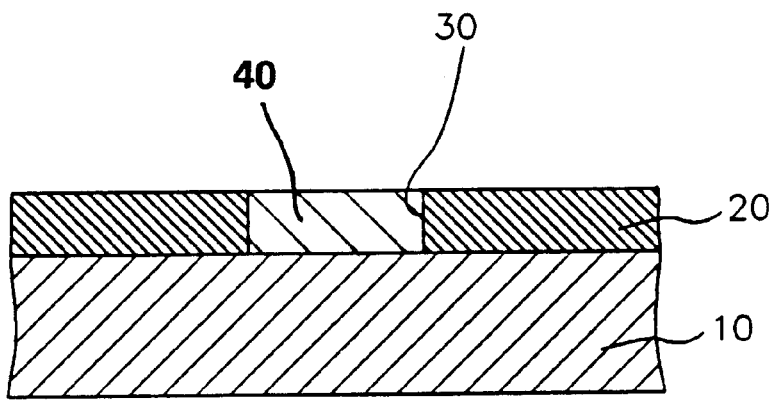
Figure 2A:
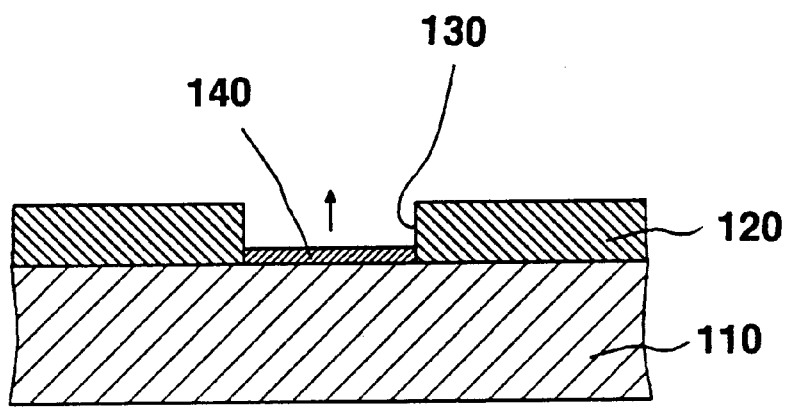
FIGS. 2A and 2B depict schematic diagrams for depositing a metal in holes using a selective chemical vapor deposition method.
Figure 2B:
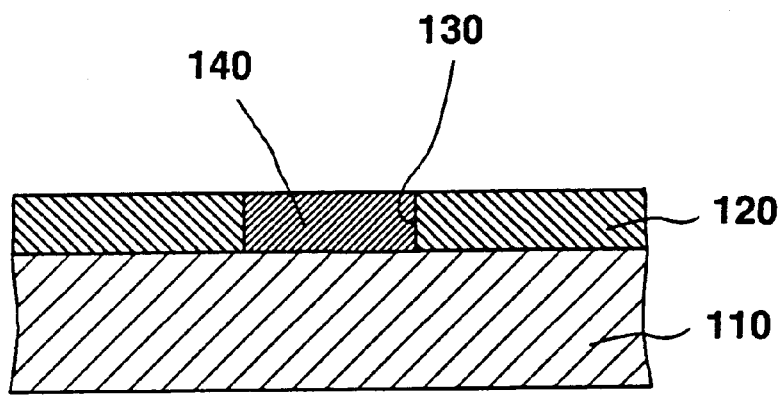
Figure 3:
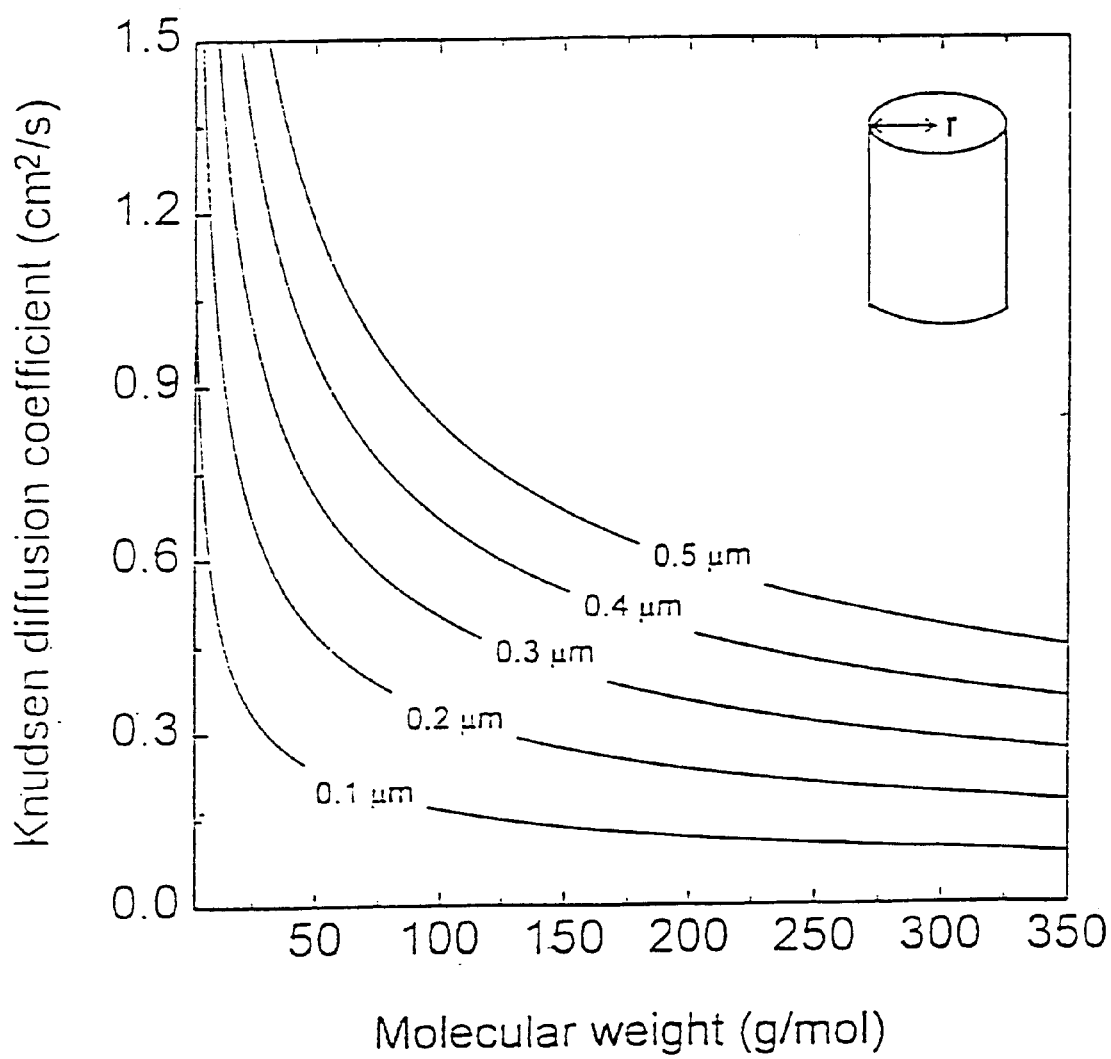
FIG. 3 exhibits the variation of the Knudsen diffusion coefficient in submicron hole as function of the molecular weight of the reactant and the size of the holes.

As can be seen from Eq. 1, the Knudsen diffusion coefficient is proportional to the radius of the hole and it decreases as the molecular weight of the reactant increases, and as the temperature of the gas decreases. This phenomenon is illustrated in FIG. 3.

Figure 4A:
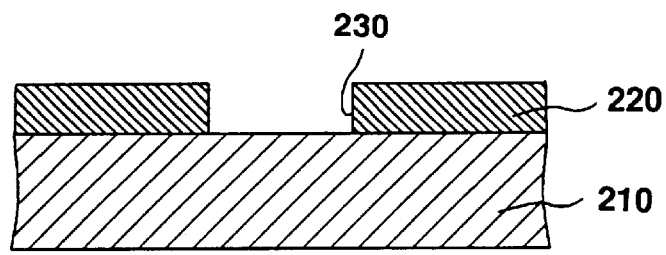
FIGS. 4A to 4D present schematic diagrams of the process of forming metal plugs in accordance with the present invention.

By exploiting the characteristics of Knudsen diffusion discussed above, it is possible to render only the outer surface of an insulating layer of a semiconductor device resistant toward metal deposition by way of adsorption of a layer of a blocking agent thereon, while keeping the inside walls of holes free of deposited blocking agent. The semiconductor device thus treated may then be subjected to a conventional chemical vapor deposition procedure using an appropriate gas precursor or organometallic compound to deposit a metal in the holes, but not on the blocked surface of the insulating layer, to form a metallic interconnective plug in each hole which extends from the bottom of the hole to the surface-level of the insulating layer. Thus, the process of preparing a metallic interconnective plug in accordance with the present invention may be explained in conjunction with FIGS. 4A to 4D as follows:

As illustrated in FIG. 4A, an insulating layer(220) is formed on the surface of a semiconductor substrate (210), and then, a given portion of the insulating layer (220) is removed in a predetermined pattern to form a hole (230).

The semiconductor substrate used in the present invention may be a silicon used in D-RAM, S-RAM, F-RAM, Logic, ASIC(application specific integrated circuit), microprocessor and TFT(thin film transistor) or any other semiconductor substrates such as GaAs, InP and the metal layer of the semiconductor devices is made from tungsten, aluminum or copper. The insulating layer in the present invention include silicon oxide, $Ta_2O_5$, BSTO(barium strontium titanium oxide) or PZTO(lead zirconium titanium oxide) layer.

Figure 4B:
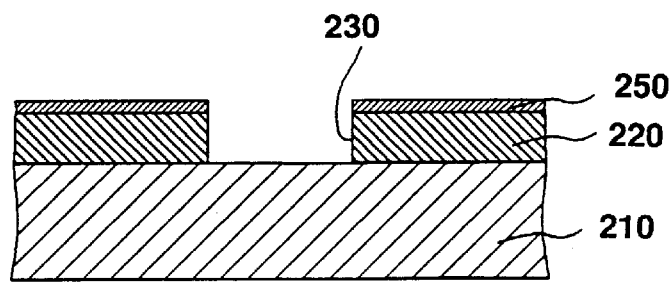

Then, referring to FIG. 4B, the vapor of a blocking agent such as $(CH_3)_3SiCl$, $(CH_3)_3SiN(CH_3)_2$, $(CH_3)_3CCH_2SiN(CH_3)_2$, $Cu(hexafluoroacetylacetonate)trimethylvinylsilane$, tetrakisdimethylamido titanium(TDMAT, $Ti[N(CH_3)_2]_4$) and tetrakisdiethylamido titanium(TDEAT, $Ti[N(CH_2CH_3)_2]_4$) is introduced to the surface of the insulating layer (220) at a temperature ranging from a room temperature to 100° C. under a pressure ranging from $10^{-12}$ to 10 torr and for an exposure time of $10^{-5}$ to 100 seconds to form a blocking layer (250) only on the surface of the insulating layer, while keeping the inner walls of the hole substantially free of the blocking agent.

The exposure time can be varied depending on the molecular weight of the blocking agent. For example, when tetrakisdimethylamido titanium is used as a blocking agent, the exposure time ranges from $10^{-5}$ to 15 seconds as shown in Table I.

The blocking layer (250) makes the top surface of the insulating layer passive, i.e., the blocking layer makes it difficult for a gas precursor or organometallic compound to adsorb, thereby preventing a metal layer from forming thereon.

Figure 4C:
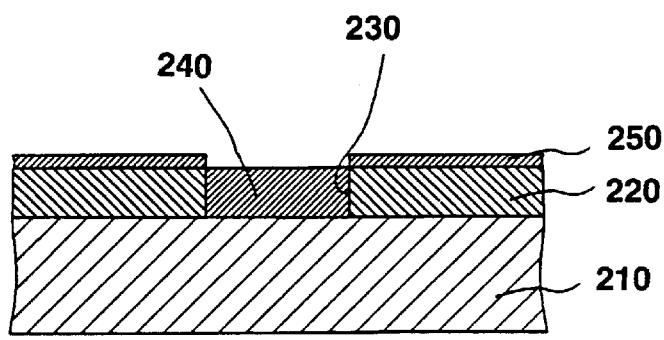
Figure 4D:
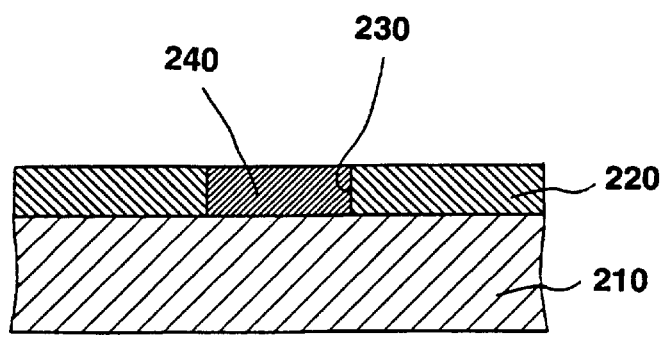

Now referring to FIG. 4C, when the device is exposed to an organometallic precursor, a metal layer(240) is vapor-deposited only in the inside of the hole(230), but not on the passivated surface of the insulating layer. For example, when dimethylethylamine alane (DMEAA, $AlH_3N[C_2H_5(CH_3)_2]$) is employed, the hole(230) is filled with aluminum under the condition of Table I. Other conducting materials such as copper, silver and platinum may also be used to fill holes of a semiconductor device in a similar manner in accordance with the present invention. For example, the temperature of deposition may ranges from 50 to 400° C.

TABLE I

|  | Blocking Layer (TDMAT) | Metal Layer (Al) |
| --- | --- | --- |
| Temperature of the substrate (° C.) | 25 | 130–250 |
| Flow rate of the carrier gas in bubbler (sccm) | — | 5($H_2$) |
| Temperature of the bubbler (° C.) | 25 | 25 |
| Reaction pressure (Torr) | $10^{-12}$–10 | 0.1–10 |
| Time | $10^{-5}$–15 seconds | 1–10 minutes |

Finally, the blocking layer formed on the insulating layer (20) may be removed by a conventional cleaning process.

The process of the present invention can be advantageously applied to a device wherein a thin layer of a diffusion barrier material, e.g., TiN, TaN and TiSiN is coated on the surface of the insulating layer and inner surfaces of holes.

The present invention is further described and illustrated in Example, which are, however, not intended to limit the scope of the present invention.

EXAMPLE 1

An insulating layer of $SiO_2$ was formed on the surface of a silicon substrate by using tetraethylorthosilicate (Si$(OC_2H_5)_4$) and oxygen gas at 700° C., and etched in a predetermined pattern to form holes. It was then exposed to tetrakisdimethylamido titanium (TDMAT) at 25° C. under 0.1 Torr for 10 seconds to selectively form a blocking layer on the insulating layer.

Figure 5A:
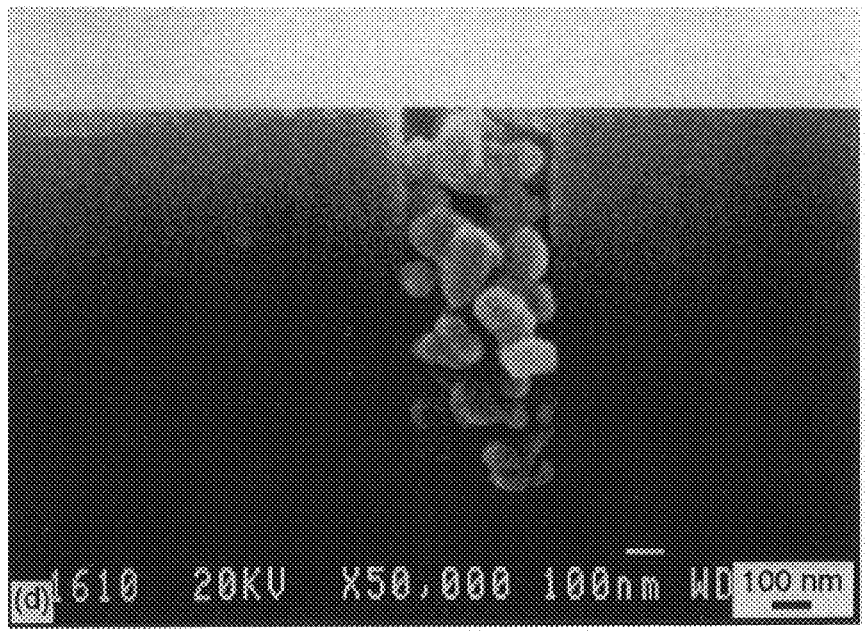
FIG. 5A illustrates a cross-sectional view of the thin layer formed in accordance with Example 1 and FIGS. 5B, 5C and 5D demonstrate cross-sectional views of the thin layers formed in accordance with Comparative Examples 1, 2 and 3, respectively.

Dimethylethylamine alane(DMEAA, $AlH_3N[C_2H_5(CH_3)_2]$) was then introduced to the substrate at 130° C. under 0.2 Torr for 5 minutes to deposit an aluminum layer. As can be seen from FIG. 5A, aluminum was deposited only in the inside of the hole to form an aluminum plug, while no aluminum layer was formed on the insulating layer protected by the blocking layer.

COMPARATIVE EXAMPLE 1

An insulating layer of $SiO_2$ was formed on the surface of a silicon substrate by using tetraethylorthosilicate (Si$(OC_2H_5)_4$) and oxygen gas at 700° C., and etched in a predetermined pattern to form holes.

Dimethylethylamine alane(DMEAA, $AlH_3N[C_2H_5(CH_3)_2]$) was introduced to the substrate at 185° C. under 0.2 Torr for 10 minutes to deposit an aluminum layer.

Figure 5B:
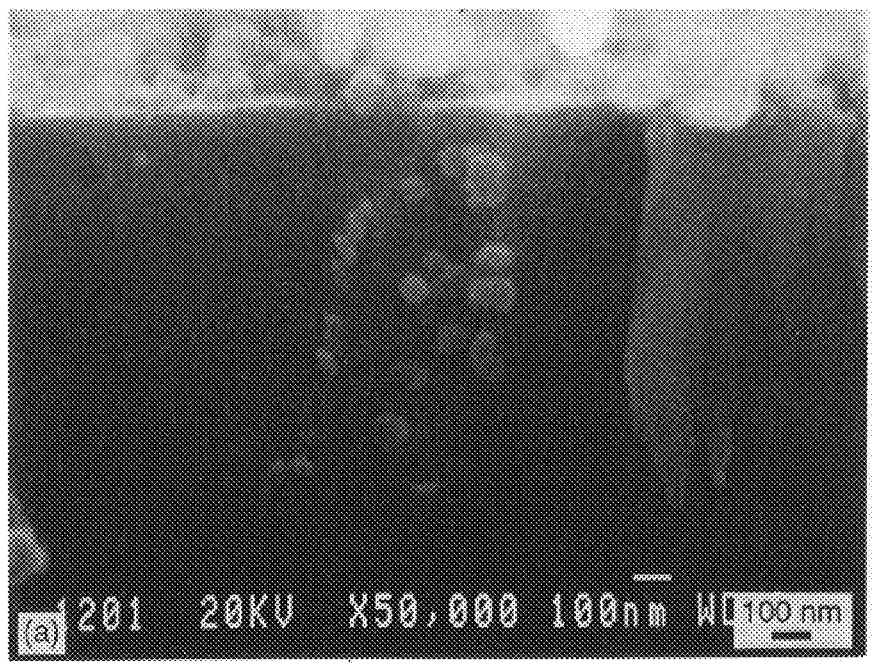

As can be seen in FIG. 5B, aluminum was deposited on the surface of the insulating layer and the step coverage was so poor that the inner void of the hole was devoid of deposited aluminum.

COMPARATIVE EXAMPLE 2

An insulating layer of $SiO_2$ was formed on the surface of a silicon substrate by using tetraethylorthosilicate ($Si(OC_2H_5)_4$) and oxygen gas at 700° C., and etched in a predetermined pattern to form holes. It was then exposed to TDMAT at 25° C. under 0.1 Torr for a prolonged contact time of 30 seconds to form a blocking layer on the insulating layer as well as on the inner surface of the holes.

Dimethylethylamine alane(DMEAA, $AlH_3N[C_2H_5(CH_3)_2]$) was then introduced to the substrate at 185° C. under 0.2 Torr for 60 minutes to deposit an aluminum layer.

Figure 5C:
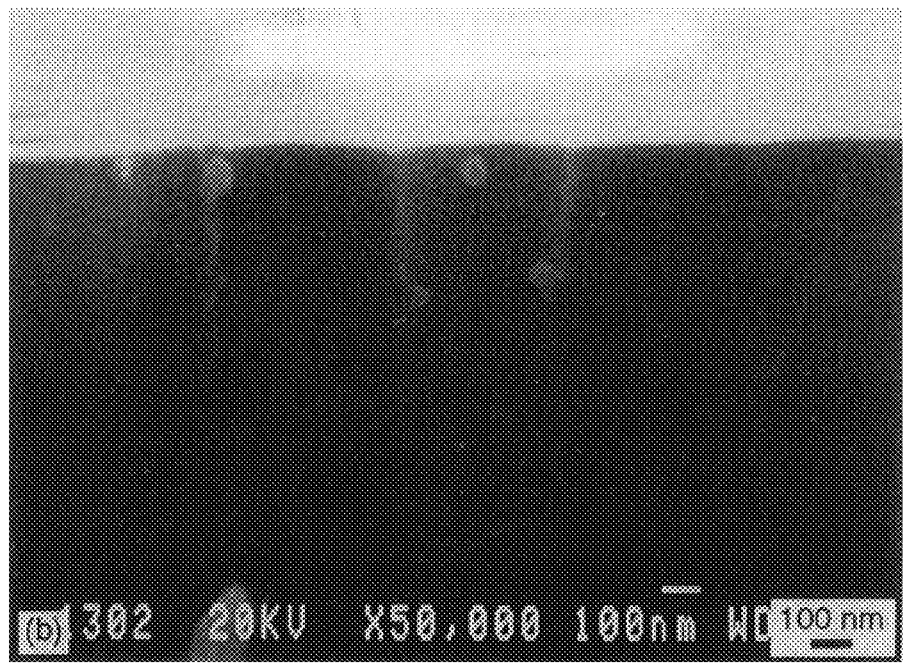

As can be seen from FIG. 5C, no aluminum layer was observed to form either on the insulating layer or in the holes.

COMPARATIVE EXAMPLE 3

An insulating layer of $SiO_2$ was formed on the surface of a silicon substrate by using tetraethylorthosilicate ($Si(OC_2H_5)_4$) and oxygen gas at 700° C., and etched in a predetermined pattern to form holes. It was then exposed to TDMAT at 25° C. under 0.1 Torr for 10 seconds to form a blocking layer on the insulating layer.

Dimethylethylamine alane(DMEAA, $AlH_3N[C_2H_5(CH_3)_2]$) was then introduced to the substrate at 185° C. under 0.2 Torr for prolonged period of 10 minutes to deposit an aluminum layer.

Figure 5D:
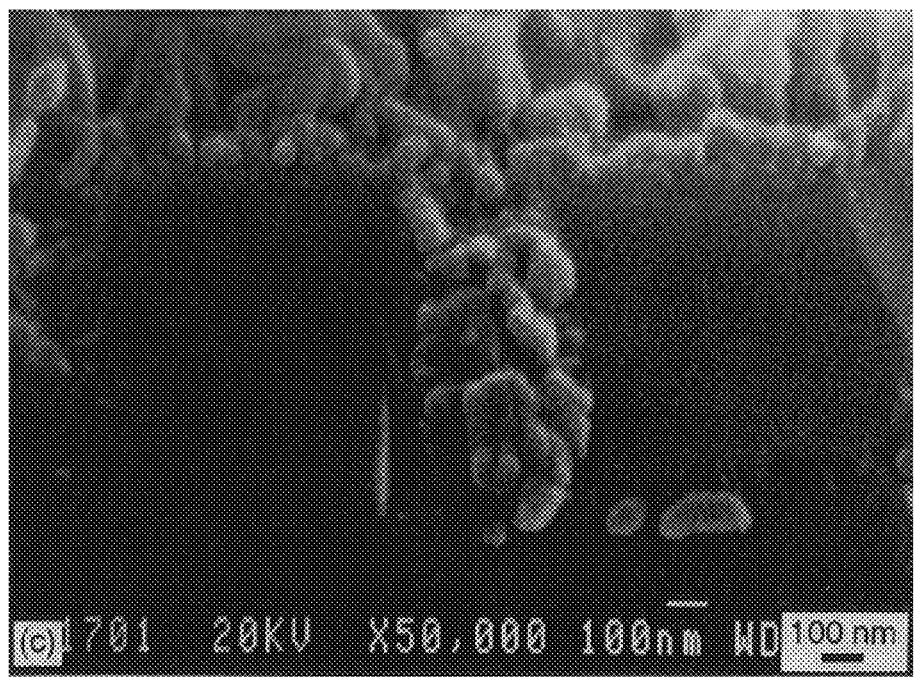

As can be seen from FIG. 5D, aluminum deposited in the hole overflows onto the surface of the insulating layer due to the long metal-deposition time.

As shown above, selective formation of an aluminum layer can be carried out by way of exposing a semiconductor substrate covered with an insulating layer with pre-formed holes to a blocking agent for a suitable time to selectively form a blocking layer on the outer surface of insulting layer and then depositing aluminum selectively in the holes.

While the invention has been described with respect to the specific embodiments, it should be recognized that various modifications and changes may be made by those skilled in the art to the invention which also fall within the scope of the invention as defined by the appended claims.

What is claimed is:

1. A process for preparing a metallic interconnecting plug in a semiconductor device which comprises the steps of: i) forming an insulating layer on the surface of a semiconductor substrate or a metal underlayer of the semiconductor device, ii) forming a hole in the insulating layer to expose the surface of the semiconductor substrate or the metal underlayer, iii) exposing the surface of the insulating layer to the vapor of a blocking agent under a pressure ranging from $10^{-12}$ to 10 torr for a controlled time period so that a layer of the blocking agent is formed only on the outer surface of the insulating layer, the layer of the blocking agent not extending over the inside walls of the hole, whereby the vapor of blocking agent follows the Knudsen diffusion rate expressed by the following formula:

$$D_{K,\infty} = \frac{2r}{3}\left(\frac{8RT}{\pi M}\right)^{1/2}$$

wherein:

r is hole radius,

R is the gas constant,

T is the temperature of the gas, and

M is the molecular weight, iv) selectively depositing a conductive metal in the hole using a chemical vapor deposition method to form the metallic interconnecting plug which extends from the surface of the semiconductor substrate or the metal underlayer to the level of the outer surface of the insulating layer, and v) removing the layer of the blocking agent from the surface of the insulating layer.

2. The process of claim 1, wherein the blocking agent is selected from the group consisting of $(CH_3)_3SiCl$, $(CH_3)_3SiN(CH_3)_2$, $(CH_3)_3CCH_2SiN(CH_3)_2$, Cu(hexafluoroacetylacetonate)trimethylvinylsilane, tetrakisdimethylamido titanium, tetrakisdiethylamido titanium and a mixture thereof.

3. The process of claim 1, wherein the semiconductor substrate is a silicon, GaAs or InP wafer.

4. The process of claim 1, wherein the insulating layer is a silicon oxide layer.

5. The process of claim 1, wherein the metallic plug is derived from a metal selected from the group consisting of aluminum, copper, silver and platinum.

6. The process of claim 5, wherein the metal is aluminum.

7. The process of claim 1, wherein the metallic plug is deposited at a temperature ranging from 50 to 400° C.

8. The process of claim 1, further comprising the step of forming a diffusion barrier on the surface of the insulating layer and inner surfaces of the hole after step ii) by way of depositing a layer of a compound selected from the group consisting of TiN, TaN, TiSiN and a mixture thereof.

* * * * *